(12) United States Patent
Tröger

(10) Patent No.: US 10,502,765 B2
(45) Date of Patent: Dec. 10, 2019

(54) SENSOR MODULE OF A MODULAR PLUG CONNECTOR

(71) Applicant: HARTING Electric GmbH & Co. KG, Espelkamp (DE)

(72) Inventor: Lutz Tröger, Osnabrück (DE)

(73) Assignee: HARTING Electric GmbH & Co. KG, Espelkamp (DE)

( * ) Notice: Subject to any disclaimer, the term of this patent is extended or adjusted under 35 U.S.C. 154(b) by 201 days.

(21) Appl. No.: 15/561,934

(22) PCT Filed: Mar. 23, 2016

(86) PCT No.: PCT/DE2016/100137
§ 371 (c)(1),
(2) Date: Sep. 26, 2017

(87) PCT Pub. No.: WO2016/155702
PCT Pub. Date: Oct. 6, 2016

(65) Prior Publication Data
US 2018/0113155 A1 Apr. 26, 2018

(30) Foreign Application Priority Data
Mar. 30, 2015 (DE) .................... 10 2015 104 838

(51) Int. Cl.
*G01R 15/18* (2006.01)
*H01R 13/514* (2006.01)
(Continued)

(52) U.S. Cl.
CPC ....... *G01R 15/181* (2013.01); *G01R 19/0092* (2013.01); *H01R 13/514* (2013.01); *H01R 13/6683* (2013.01)

(58) Field of Classification Search
CPC .............. G01R 15/181; G01R 19/0092; H05K 2201/1003; H01L 2224/44; H01L 2224/45;
(Continued)

(56) References Cited

U.S. PATENT DOCUMENTS 3,024,434 A * 3/1962 Carson, Jr. .............. H01F 38/38
174/551
3,423,709 A * 1/1969 Lugten .................... H01F 30/10
336/170
(Continued)

FOREIGN PATENT DOCUMENTS

DE         44 35 864 A1    4/1996
DE   10 2006 041 610 B3    5/2008
(Continued)

OTHER PUBLICATIONS

Russian Search Report, dated Jun. 25, 2018, for Russian Application No. 2017124985, 2 pages.
(Continued)

*Primary Examiner* — Steven L Yeninas
(74) *Attorney, Agent, or Firm* — Seed IP Law Group LLP

(57) ABSTRACT

The disclosure relates to a sensor module for a modular plug connector, wherein the sensor module comprises a core segment and at least two outer segments arranged around the latter, wherein the segments enclose a cavity with one another when assembled. In the cavity, conductor tracks are fitted, preferably with the aid of MID technology, wherein all the conductor tracks in the connected state together form the shape of an annular coil. In a sensor circuit, the annular coil can measure the current flow of a contact element in accordance with the Rogowski principle, which contact element is likewise integrated in the sensor module.

9 Claims, 3 Drawing Sheets

(51) Int. Cl.
*H01R 13/66* (2006.01)
*G01R 19/00* (2006.01)

(58) Field of Classification Search
CPC . H01L 2224/45001; H01L 2224/15005; H01L 2224/4501; H01L 2224/48; H01L 2224/4801; H01L 2224/4807; H01L 2224/48091; H01L 2224/48092; H01R 13/502; H01R 13/504; H01R 13/5045; H01R 13/506514; H01R 13/6633; H01R 13/6683
USPC ........ 307/17; 324/127, 150; 336/65, 82, 83, 336/90, 186, 192, 198, 200, 208, 212, 336/221, 174, 229
See application file for complete search history.

(56) References Cited

U.S. PATENT DOCUMENTS

| | | | | |
|---|---|---|---|---|
| 3,477,051 | A * | 11/1969 | Clark | C25D 21/10 29/606 |
| 6,008,711 | A * | 12/1999 | Bolam | H01F 38/30 324/107 |
| 6,642,827 | B1 * | 11/2003 | McWilliams | H01F 27/324 29/602.1 |
| 7,322,842 | B2 | 1/2008 | Dück et al. | |
| 8,552,825 | B2 * | 10/2013 | Chou | H01F 3/10 336/55 |
| 9,312,059 | B2 * | 4/2016 | Dinh | H01F 17/06 |
| 2007/0025065 | A1 | 2/2007 | Tanizawa | |
| 2007/0063807 | A1 * | 3/2007 | Quilici | H01F 17/0033 336/223 |
| 2008/0048646 | A1 | 2/2008 | Wilkerson et al. | |
| 2011/0148561 | A1 * | 6/2011 | Lint | G01R 15/181 336/192 |
| 2013/0043967 | A1 | 2/2013 | Rouaud et al. | |
| 2013/0063129 | A1 * | 3/2013 | Chamarti | G01R 15/181 324/126 |
| 2013/0235527 | A1 * | 9/2013 | Wagner | H05K 1/0203 361/702 |
| 2013/0316561 | A1 | 11/2013 | Urban | |
| 2015/0061817 | A1 * | 3/2015 | Lee | H01F 17/0013 336/221 |

FOREIGN PATENT DOCUMENTS

| | | |
|---|---|---|
| DE | 20 2007 018 306 U1 | 6/2008 |
| DE | 10 2007 035 184 A1 | 2/2009 |
| EP | 1 353 412 A2 | 10/2003 |
| EP | 2 369 693 A1 | 9/2011 |
| EP | 2 568 300 A2 | 3/2013 |

OTHER PUBLICATIONS

German Office Action, dated Oct. 1, 2015, for German Application No. 10 2015 104 838.8, 6 pages.
International Search Report and Written Opinion, dated Aug. 1, 2016, for International Application No. PCT/DE2016/100137, 13 pages. (with English Translation of Search Report).
International Preliminary Report on Patentability, dated Oct. 3, 2017, for International Application No. PCT/DE2016/100137, 8 pages. (English Translation).

* cited by examiner

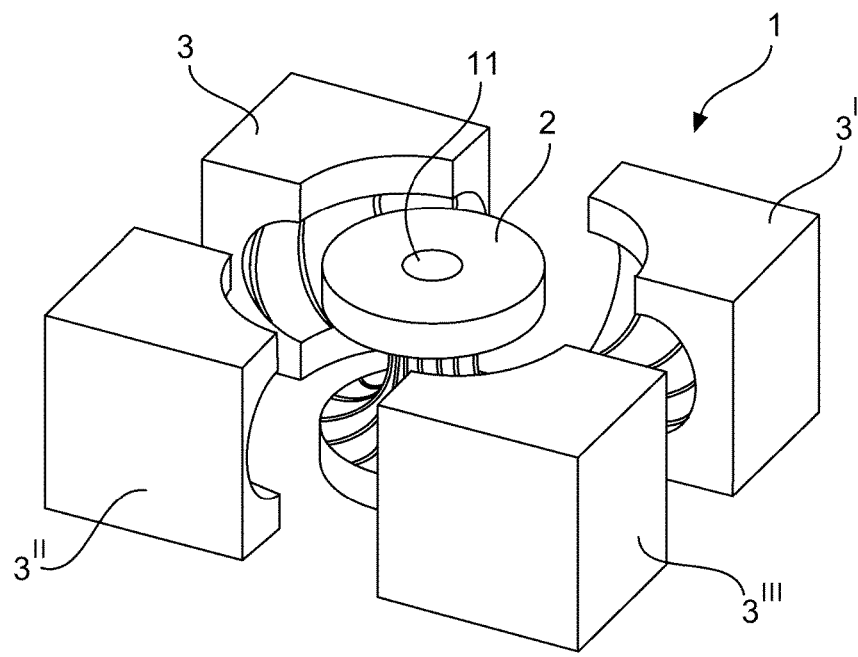
Fig.1
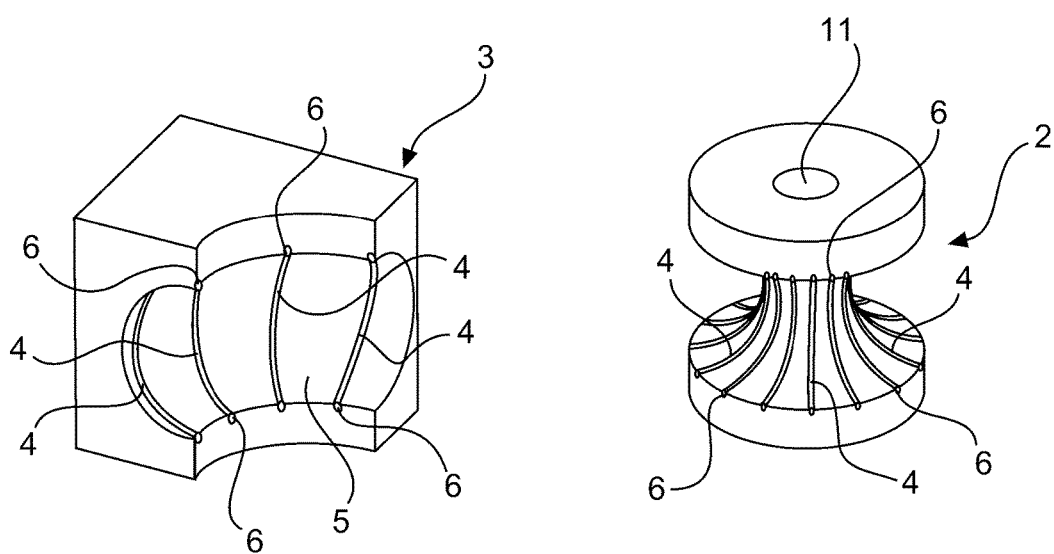
Fig.2a
Fig.2b

SENSOR MODULE OF A MODULAR PLUG CONNECTOR

BACKGROUND

Technical Field

The present disclosure relates to a sensor module for a modular plug connector.

Description of the Related Art

Modular plug connectors are used in particular in mechanical engineering and construction and in plant engineering and construction.

A modular plug connector is known by way of example from EP 1 353 412 A2. A series of different data signals and currents are directed via plug connectors of this type. Plug connectors of this type frequently lack space.

US 2008/0048646 A1 and DE 10 2007 035 184 A1 each disclose disc-shaped current sensors having a central feed-through for a cable.

US 2011/0148561 A1 discloses an annular sensor that is configured from individual coil segments.

DE 20 2007 018 306 U1 discloses a modular plug connector having a module 6 that is configured as a measuring device.

In order by way of example to be able to improve the monitoring of machines and plant, Applicant believes it would be fundamentally of advantage if the signals and/or currents that are passing into the machine or plant could be monitored. This would render it possible by way of example to be able to obtain forecasts regarding the state of a machine.

BRIEF SUMMARY

Embodiments of the present invention provide a sensor element for a modular plug connector, wherein said sensor element can be installed in a space-saving manner and still function effectively.

A sensor module in accordance with an embodiment of the present invention is intended for use in a modular plug connector. Plug connectors of this type generally comprise a so-called articulated frame in which multiple, frequently different, modules can be inserted. The number of places for modules in the articulated frame is limited. The sensor module that is proposed in this case comprises a core segment and at least two outer segments that are arranged around said core segment. In the assembled state, the segments enclose with one another a hollow chamber.

In an advantageous embodiment, the sensor module is formed from a dumbbell-shaped core segment and four outer segments that are arranged around said core segment. The individual segments are generally embodied from a synthetic material and are relatively simple to produce from the aspect of manufacturing technology.

It is preferred that the hollow chamber is the space that the segments enclose with one another in an annular manner. This annular shape is in particular suitable for the purpose of receiving a component of a sensor.

The annular shape is preferably achieved by virtue of the fact that the outer segments comprise a concave curvature that faces the core segment and multiple conductor tracks are provided on the surfaces of each concave curvature, wherein multiple conductor tracks are applied to the peripheral surface of the core segment.

It is preferred that the individual conductor tracks each comprise contact sites by way of which a conductor track of one segment can be connected in an electrical manner to at least one conductor track of another segment. These contact sites can be embodied by way of example as solder pads on a circuit board. If all the conductor tracks are connected by way of contact sites, the shape is created of a so-called annular coil.

It is preferred that the individual conductor tracks each comprise two contact sites and a conductor track of one segment is connected in an electrical manner to at least two conductor tracks of another segment. As a consequence, the shape of the annular coil is achieved.

It is preferred that the contact sites are embodied or configured in a planar manner. The respective contact sites comprise a larger surface area than the surface area of the cross-sectional area of the respective conductor tracks. The contact sites are used to connect the conductor tracks of the segments in an electrical manner. The contact sites must be connected to one another in an electrical manner. In this respect, a large connection area is advantageous. In order to exploit the advantages of the molded interconnect device (MID) technology, it would be possible to imagine a contact that represents a type of V-shaped trough into which a cylinder or a likewise V-shaped contact is pressed. From the technical aspect, it is advantageous if the contact does not represent any change from the effective power diameter in order not to generate an impedance surge.

In an advantageous embodiment of the invention, the contacting contact sites of the segments are adhered to one another by an electrically conductive adhesive. The segments are also connected to one another by way of example simultaneously by way of this adhesive bond. Further connecting techniques can however also be used in this case.

It is preferred that the conductor tracks are produced with the aid of MID technology. The MID-capable synthetic material can be brought into the required segment shape very easily using an injection molding method. The process of coating the conductor tracks can likewise be performed easily in the case of segment shapes of this type. A suitable MID technique for producing the conductor tracks is described by way of example in DE 10 2006 041 610 B3.

In an advantageous embodiment of the invention, at least one outer segment comprises at least one feed-through, wherein the feed-through extends from the hollow chamber to an exit surface of an outer surface of the outer segment. Two such feed-throughs are generally provided.

Since the annular coil is part of a sensor circuit, it must be possible to touch the annular coil in an electrical manner. In other words, it must be possible to contact the annular coil in an electrical manner. It is possible by way of the feed-throughs to contact in an electrical manner the annular coil that is enclosed in the sensor module. For this purpose, the feed-through is coated with an electrically conductive material or it comprises an electrically conductive material. An electrically conductive connection is provided between a conductor track, and to the annular coil as a whole, and the exit surface by way of the feed-through. The exit surface can be by way of example embodied as a solder pad on a circuit board.

It is preferred that the annular coil is used in the sensor module in a so-called Rogowski arrangement for measuring alternating currents.

BRIEF DESCRIPTION OF THE SEVERAL VIEWS OF THE DRAWINGS

An exemplary embodiment of the invention is illustrated in the drawings and further explained hereinunder. In the drawings:

FIG. 1 illustrates a perspective exploded view of a sensor module,

FIG. 2a illustrates a perspective view of an outer segment,

FIG. 2b illustrates a perspective view of a core segment,

DETAILED DESCRIPTION

Figure 3:
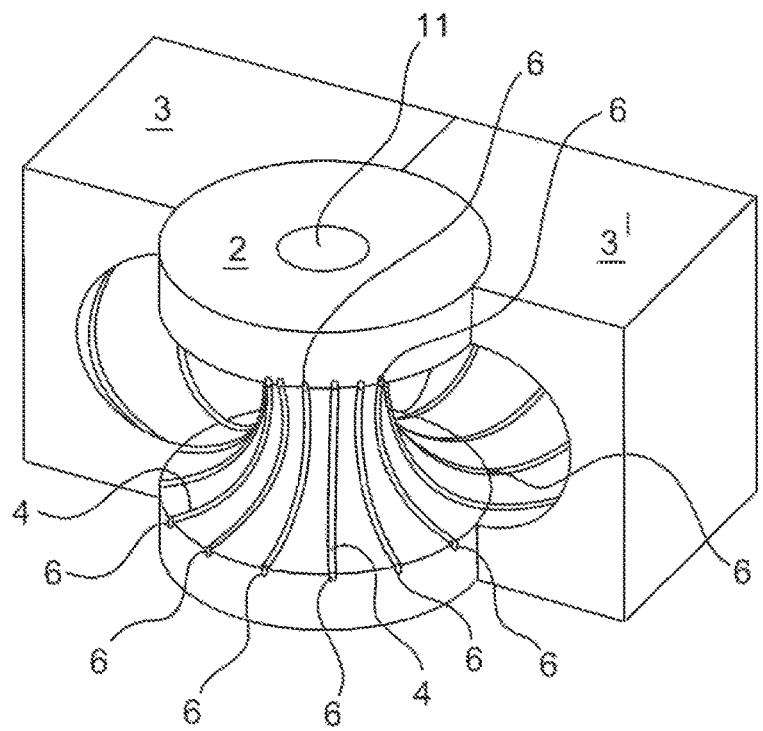
FIG. 3 illustrates a perspective view of the core segment having two connected outer segments.

The figures show in part simplified schematic illustrations. Identical reference numerals are used in part for identical elements but where appropriate also for non-identical elements. Different views of identical elements could be scaled differently.

FIG. 1 illustrates a perspective exploded view of a sensor module 1 in accordance with an embodiment of the invention. A core segment 2 is surrounded by four outer segments 3, 3', 3", 3'". An outer segment 3 is illustrated again separately in FIG. 2a. FIG. 2b illustrates a single core segment 2.

The core segment 2 has essentially a dumbbell shape. Conductor tracks 4 are applied along the peripheral surface in the axial direction. The outer segment 3 has essentially the shape of a cube or cuboid, wherein a circular segment is cut out at one edge. The outer segment is moreover concave in the region of this cut-out. Conductor tracks 4 are applied to the surface of the concave curvature 5.

Contact sites 6 are provided on the ends of the respective conductor tracks 4. These contact sites 6 are illustrated only in an exemplary manner in the FIGS. 2a and 2b. The contact sites have a larger surface area than the surface area of the conductor track cross-section. The individual conductor tracks 4 are contacted in an electrical manner by way of the contact sites 6. When the segments 2, 3, 3', 3", 3'" are joined together, the contact sites 6 of the associated conductor pairs match one another. When all the segments 2, 3, 3', 3", 3'" are joined together, the contacting conductor tracks 4 form an annular coil 7 as illustrated in FIG. 4.

Figure 4:
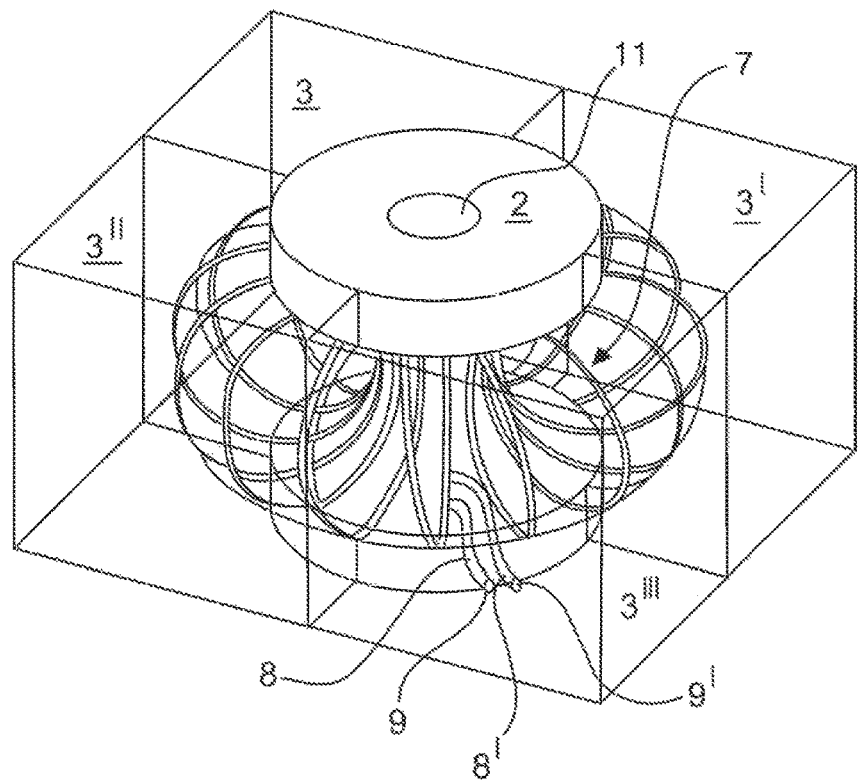
FIG. 4 illustrates a perspective view of the sensor module having outer segments that are illustrated in a transparent manner.

With reference to FIG. 4, an outer segment 3'" comprises two feed-throughs 8, 8'. Such a feed-through is a bore hole or another other opening that extends from the hollow chamber as far as an exit surface 9, 9' of an outer surface of the outer segment 3'". The feed-throughs 8, 8' are coated with an electrically conductive material or filled with an electrically conductive material. As a consequence, an electrically conductive connection is produced between a conductor track 4 or the annular coil 7 and the exit surface 9, 9'. The annular coil 7 can be contacted in an electrical manner by way of the exit surfaces 9, 9' and can be integrated in a switching circuit, by way of example in a Rogowski sensor switching circuit.

The sensor module 1 comprises an opening 11 in which it is possible to arrange a contact element (not illustrated). The sensor module 1 can deliver information regarding the current flow in the contact element. It is also possible to provide multiple openings and associated contact elements in the sensor module. Furthermore, it is also possible to provide multiple annular coils in the sensor module. MID technology renders it possible to produce such sensor modules with a precise and small construction. The sensor module renders it possible to evaluate data during the operation of a plug connector (not illustrated).

Figure 5:
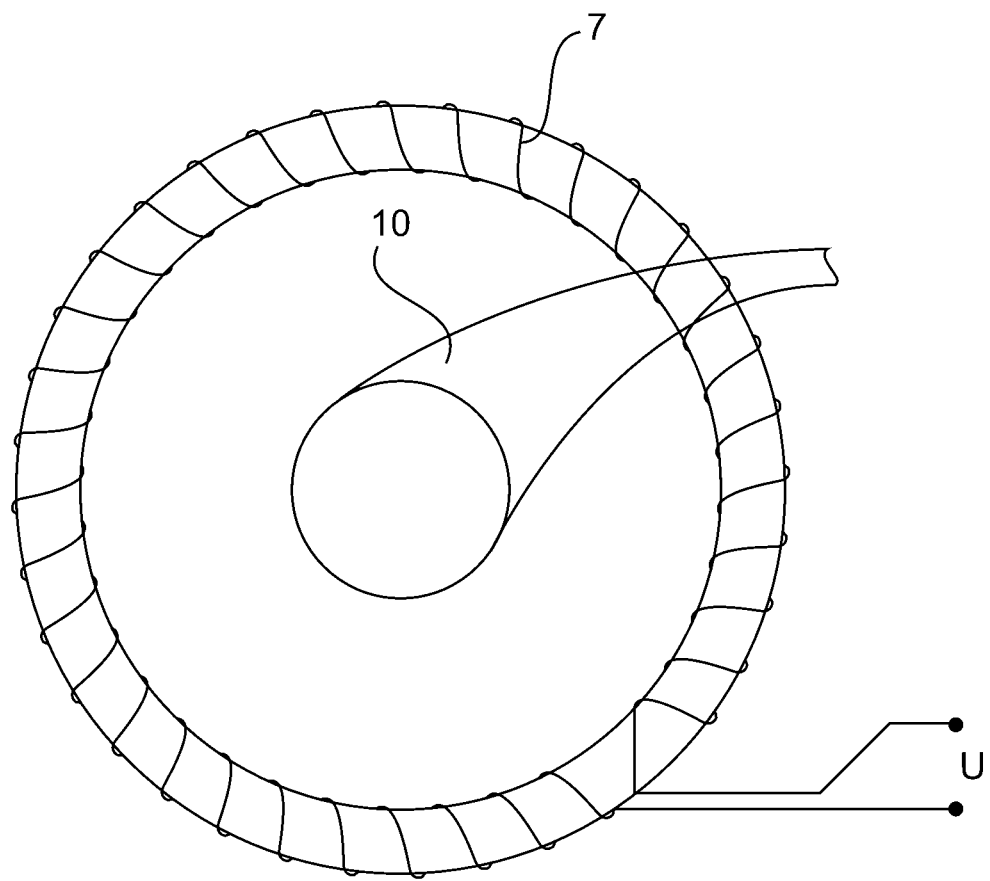
FIG. 5 illustrates an electric circuit diagram.

FIG. 5 illustrates a simplified sketch of a possible sensor measuring principle using an annular coil. A conductor or a contact element 10 is arranged within the annular coil 7. The alternating current that is flowing through the conductor or the contact element 10 generates a changing magnetic field that induces a voltage U in the annular coil 7. This voltage U can be tapped by way of example by way of the exit surfaces 9, 9'.

The disclosure is summarized again in short hereinunder. The disclosure relates to a sensor module for a modular plug connector, wherein the sensor module 1 comprises a core segment 2 and at least two outer segments 3, 3', 3", 3'" that are arranged around said core segment, wherein the segments 2, 3, 3', 3", 3'" in the assembled state enclose with one another a hollow chamber. Conductor tracks 4 are applied in the hollow chamber with the aid of MID technology, wherein all the conductor tracks 4 in the connected state form together the shape of an annular coil (7). The annular coil can measure the current flow in a contact element utilizing the Rogowski principle in a sensor circuit, said contact element being likewise integrated in the sensor module.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A sensor module for a modular plug connector, wherein:
    an annular coil that can be used to measure alternating currents is arranged within the sensor module,
    the sensor module comprises a dumbbell-shaped core segment and two or four outer segments that are arranged around the core segment,
    the segments in an assembled state enclose a hollow chamber,
    the outer segments comprise a concave curvature that is facing the core segment and in each case multiple conductor tracks are applied to surfaces of said outer segments, and
    multiple conductor tracks are applied to a peripheral surface of the core segment.

2. The sensor module as claimed in claim 1, wherein the hollow chamber is annular shaped.

3. The sensor module as claimed in claim 1, wherein the individual conductor tracks comprise in each case contact sites by way of which it is possible to connect in an electrical manner a conductor track of one segment to at least one conductor track of another segment, and wherein all the conductor tracks in the connected state together form the annular coil.

4. The sensor module as claimed in claim 3, wherein the contact sites are embodied in a planar manner and comprise a larger surface area than the surface area of the cross-sectional area of the conductor tracks.

5. The sensor module as claimed in claim 1, wherein the individual conductor tracks comprise in each case two contact sites, and wherein a conductor track of one segment can be connected in an electrical manner to at least two conductor tracks of another segment.

6. The sensor module as claimed in claim 5, wherein the contacting contact sites of the segments are adhered to one another by an electrically conductive adhesive.

7. The sensor module as claimed in claim 1, wherein the conductor tracks are produced with the aid of molded interconnect device (MID) technology.

8. A system comprising a sensor module as claimed in claim 1 and a modular plug connector.

9. A sensor module for a modular plug connector, wherein:
- an annular coil that can be used to measure alternating currents is arranged within the sensor module,
- the sensor module comprises a dumbbell-shaped core segment and two or four outer segments that are arranged around the core segment,
- the segments in an assembled state enclose a hollow chamber,
- at least one outer segment comprises at least one feed-through, wherein the feed-through extends from the hollow chamber as far as an exit surface of an outer surface of the outer segment,
- the feed-through is coated with an electrically conductive material or comprises an electrically conductive material, and
- an electrically conductive connection is provided between a conductor track and the exit surface by way of the feed-through.

* * * * *